(12) United States Patent
Chen et al.

(10) Patent No.: US 10,916,481 B2
(45) Date of Patent: Feb. 9, 2021

(54) THICKNESS SENSOR FOR CONDUCTIVE FEATURES

(71) Applicant: Taiwan Semiconductor Manufacturing Co., Ltd., Hsinchu (TW)

(72) Inventors: Chih Hung Chen, Hsinchu (TW); Kei-Wei Chen, Tainan (TW); Ying-Lang Wang, Fai-Chung County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 19 days.

(21) Appl. No.: 16/017,665

(22) Filed: Jun. 25, 2018

(65) Prior Publication Data
US 2019/0393107 A1 Dec. 26, 2019

(51) Int. Cl.
*H01L 21/66* (2006.01)
*H01L 21/321* (2006.01)
*B24B 37/013* (2012.01)
*G01B 7/06* (2006.01)

(52) U.S. Cl.
CPC ............ *H01L 22/26* (2013.01); *B24B 37/013* (2013.01); *G01B 7/107* (2013.01); *H01L 21/32125* (2013.01)

(58) Field of Classification Search
CPC . H01L 22/26; H01L 21/32125; B24B 37/013; G01B 7/107
See application file for complete search history.

*Primary Examiner* — Walter H Swanson
(74) *Attorney, Agent, or Firm* — Seed IP Law Group LLP

(57) ABSTRACT

Various embodiments provide a thickness sensor and method for measuring a thickness of discrete conductive features, such as conductive lines and plugs. In one embodiment, the thickness sensor generates an Eddy current in a plurality of discrete conductive features, and measures the generated Eddy current generated in the discrete conductive features. The thickness sensor has a small sensor spot size, and amplifies peaks and valleys of the measured Eddy current. The thickness sensor determines a thickness of the discrete conductive features based on a difference between a minimum amplitude value and a maximum amplitude value of the measured Eddy current.

20 Claims, 5 Drawing Sheets

THICKNESS SENSOR FOR CONDUCTIVE FEATURES

BACKGROUND

Semiconductor devices are increasingly including smaller device features. In order to fabricate such device features with desired dimensions, it is important to accurately control a thickness or depth of the device features during fabrication.

Eddy current sensors are commonly used to measure a thickness of a conductive or metal film. Current Eddy current sensors are capable of measuring thicknesses of continuous conductive films (e.g., a continuous conductive film covering a whole wafer after a metal deposition application) with acceptable accuracy. However, when such Eddy current sensors are used to measure thicknesses of discrete conductive features (e.g., metal patterns for conductive lines or plugs), the signals received by current Eddy current sensors are often weak and/or noisy. Consequently, the accuracy of measuring thicknesses of discrete conductive features with current Eddy current sensors is compromised.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
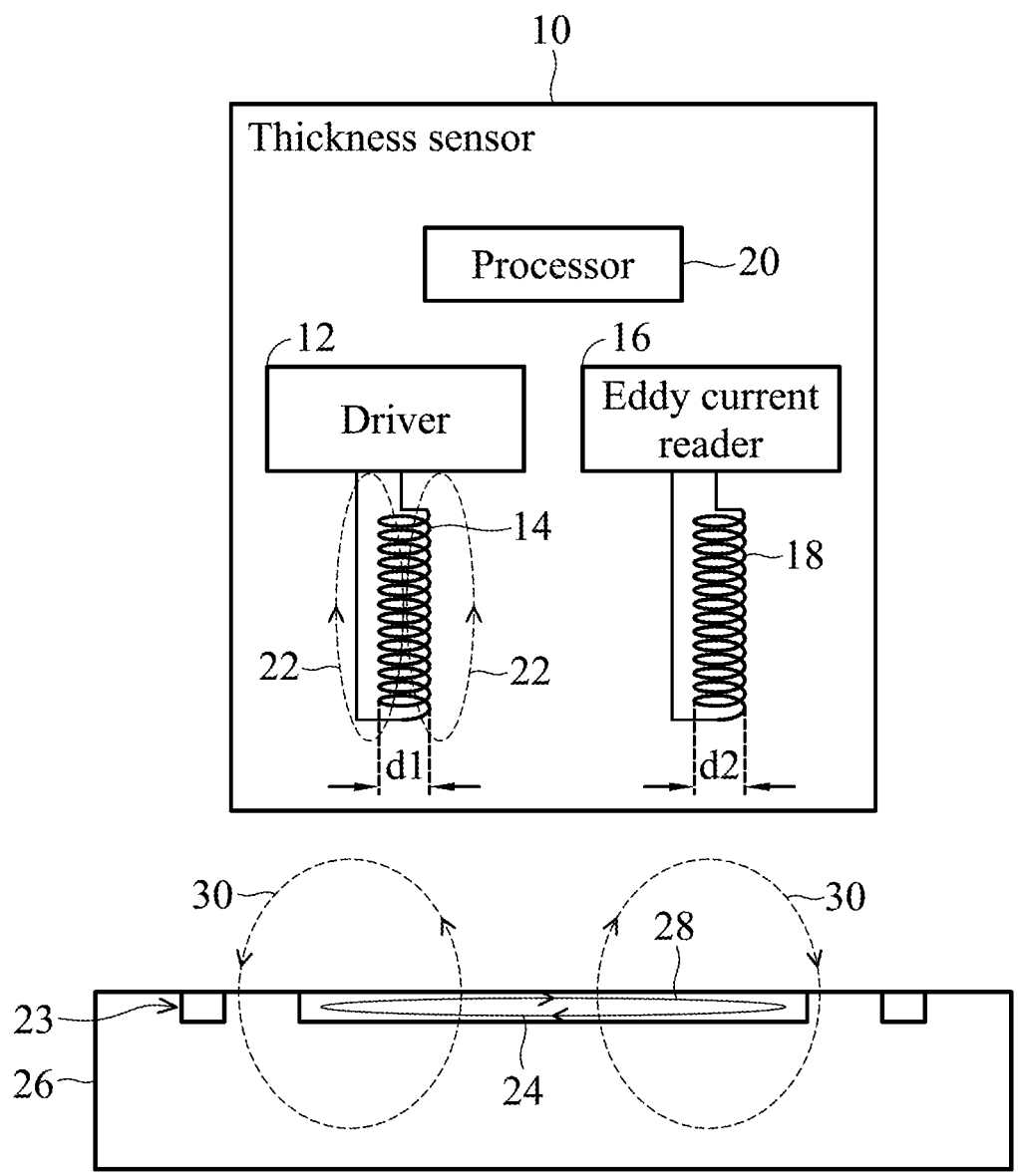
FIG. 1 is a diagram of thickness sensor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to a thickness sensor and method for measuring a thickness of conductive features on a substrate, such as conductive lines and plugs.

FIG. 1 is a diagram of a thickness sensor 10 in accordance with some embodiments. The thickness sensor 10 includes a driver 12, a drive coil 14, an Eddy current reader 16, a sensor coil 18, and a processor 20.

The driver 12 generates and provides a driving signal to the drive coil 14. In some embodiments the driving signal is an alternating current (AC) signal. In response to receiving the driving signal, the drive coil 14 generates a magnetic field 22.

When the thickness sensor 10 is disposed above or near a plurality of discrete conductive features substantially at a same level on a substrate which are separated by one or more regions of non-conductive material at substantially the same level as the discrete conductive features, the magnetic field 22 generates Eddy currents in the plurality of conductive features. For example, in the embodiment shown in FIG. 1, when the thickness sensor 10 is disposed above or near a discrete conductive feature 24 on a substrate 26, the magnetic field 22 generates an Eddy current 28 in the discrete conductive feature 24. The Eddy current 28, in turn, generates a secondary magnetic field 30. In various embodiments, the conductive features are formed from a conductive film or layer. For example, the discrete conductive feature 24 may be part of a conductive film 23.

The Eddy current reader 16 measures the Eddy current 28. In some embodiments described herein, the Eddy current reader 16 receives the secondary magnetic field 30 via the sensor coil 18, measures the Eddy current 28 based on the secondary magnetic field 30, and generates an Eddy current signal. In some embodiments, the Eddy current signal is the measured Eddy current of the Eddy current 28. The Eddy current reader 16 provides the Eddy current signal to the processor 20.

In various embodiments described herein, the drive coil 14 is a cylindrical coil having a diameter d1. In various embodiments, the sensor coil 18 is a cylindrical coil having a diameter d2. In one embodiment, the drive coil 14 and the sensor coil 18 have the same diameters (i.e., the diameter d1 is substantially equal to the diameter d2). In other embodiments, the diameter d1 of the drive coil 14 is larger than the diameter d2 of the sensor coil 18. In other embodiments, the diameter d1 of the drive coil 14 is smaller than the diameter d2 of the sensor coil 18. As will be discussed in further detail below, the diameter d2 of the sensor coil 18 determines a sensor spot size of the thickness sensor 10.

The processor 20 receives the Eddy current signal from the Eddy current reader 16 and determines various parameters of the Eddy current signal. In one embodiment, as will discussed in further detail below with respect to FIG. 4, the processor 20 determines a maximum amplitude of the Eddy current signal and a minimum amplitude of the Eddy current signal and uses these amplitudes to calculate a thickness value representing a thickness of a plurality of conductive features. In addition, in various embodiments the processor 20 controls the driver 12; however, driver 12 could be controlled by a processor (not shown) different from processor 20. In one embodiment, the processor 20 instructs the driver 12 to generate and provide the driving signal to the drive coil 14. The processor 20 may be any type of controller, microprocessor, application specific integrated circuit (ASIC), or the like that communicates with the driver 12 and the Eddy current reader 16.

It is noted that, although the driver 12, the Eddy current reader 16, and the processor 20 are shown in FIG. 1 as separate modules, the various modules may be combined with each other in to a single module. For example, in one embodiment, the functions of the Eddy current reader 16 and the processor 20 are performed by a single module. In addition, although the driver 12, the Eddy current reader 16, and the processor 20, are included within the thickness sensor 10, one or more of the driver 12, the Eddy current reader 16, and the processor 20 may be external to the thickness sensor 10. For example, in one embodiment, the processor 20 is external to the thickness sensor 10.

In accordance with embodiments described herein, the thickness sensor 10 has a small sensor spot size. The sensor spot size is the size of the area in which the Eddy current reader 16 is able to measure an Eddy current. For example, in one embodiment, the thickness sensor 10 has a sensor spot size having a diameter less than 3 millimeters. In this embodiment, the Eddy current reader 16 is able to measure an Eddy current within a circular area having a diameter less than 3 millimeters. The present description is not limited to thickness sensors having a sensor spot size diameter less than 3 millimeters, for example, thickness sensor 10 can have a sensor spot size diameter greater than 3 millimeters.

The sensor spot size is determined by the size of the sensor coil 18. A sensor spot size increases when the diameter d2 is increased, and the sensor spot size decreases when the diameter d2 is decreased. Current Eddy current sensors typically include sensor coils with large diameters, and, thus, have large sensor spot sizes. For example, current Eddy current sensors include sensor coils with diameters between 15 millimeters and 20 millimeters, and have sensor spots with diameters between 5 millimeters and 7 millimeters. In one embodiment of the sensor coils described herein, the diameter d2 of the sensor coil 18 is less than 10 millimeters. In other embodiments described herein, the diameter d2 can be 10 millimeters or greater than 10 millimeters.

Figure 2:
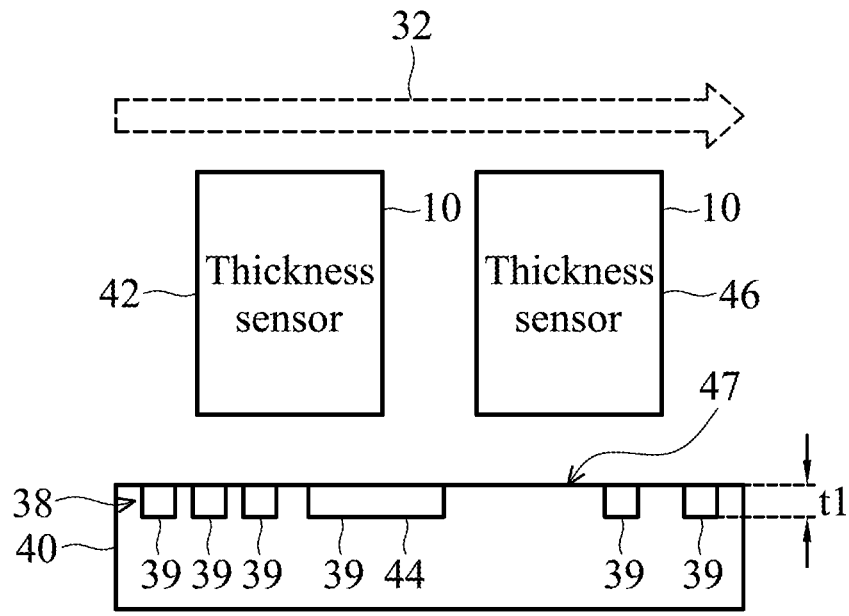
FIG. 2 is a diagram of the thickness sensor of FIG. 1 moving along a sensor sweep path in accordance with some embodiments.
Figure 3:
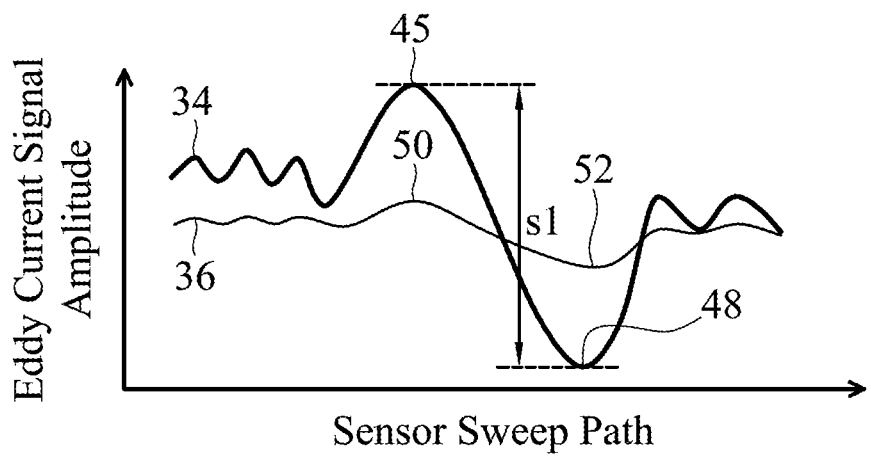
FIG. 3 is a diagram of an Eddy current signal measured by the thickness sensor of FIG. 1 in accordance with some embodiments and an Eddy current signal generated by an Eddy current sensor having a large sensor spot size.

By having a small sensor spot size, the spatial resolution of the thickness sensor 10 is increased. By having a higher spatial resolution, the thickness sensor 10, more specifically the Eddy current reader 16, is able to generate an Eddy current signal with less averaging between an area with a large amount of conductive material and an area with a small amount of conductive material. Stated differently, the thickness sensor 10 is able to amplify and exaggerate measurements of an Eddy current. As a result, peaks of the Eddy current signal, which correspond to areas with large amounts of conductive material, will have increased amplitudes, and valleys of the Eddy current signal, which correspond to areas with small amounts of conductive material, will have decreased amplitudes. FIG. 2 is a diagram of the thickness sensor 10 scanning along a sensor sweep path 32 in accordance with some embodiments. FIG. 3 is a diagram of an Eddy current signal 34 measured by the thickness sensor 10 in accordance with some embodiments and an Eddy current signal 36 generated by an Eddy current sensor having a large sensor spot size (e.g., an Eddy current sensor including a sensor coil with a diameter between 15 millimeters and 20 millimeters). The Eddy current signal 34 is in response to the thickness sensor 10 scanning along the sensor sweep path 32, and the Eddy current signal 36 is in response to the Eddy current sensor having a large sensor spot size scanning along the sensor sweep path 32. It is beneficial to review FIGS. 2 and 3 together.

In accordance with various embodiments for calculating a thickness value representing a thickness of conductive features at substantially the same level on a substrate described herein, the thickness sensor 10 scans along the sensor sweep path 32 (e.g., from left to right in FIG. 2) above a plurality of discrete conductive features 39 in a substrate 40. The plurality of discrete conductive features 39 are substantially at a same level on the substrate 40 which are separated by one or more regions of non-conductive material at substantially the same level as the discrete conductive features. The discrete conductive features 39 may be any type of conductive feature. For example, each of the discrete conductive features may be a conductive line, a conductive plug or a similar conductive feature. In various embodiments, the discrete conductive features 39 are electrically isolated from each other. In various embodiments, the discrete conductive features 39 are part of a conductive film 38. As the thickness sensor 10 moves along the sensor sweep path 32, the amplitude of the Eddy current signal 34 fluctuates depending on a number of factors, including one or more of whether the thickness sensor 10 directly overlies conductive material and the density of the conductive material which the thickness sensor directly overlies.

When the thickness sensor 10 directly overlies conductive material (e.g., a discrete conductive feature), an Eddy current is generated in the conductive material and the Eddy current signal 34 peaks. For example, as shown in FIG. 3, as the thickness sensor 10 moves along the sensor sweep path 32, the Eddy current signal 34 includes six peaks as the thickness sensor passes over six discrete conductive features which are at substantially the same level on substrate 40. When the thickness sensor 10 is in a first position 42 and directly overlies the largest discrete conductive feature 44, the Eddy current signal 34 has its largest peak 45.

When the thickness sensor 10 does not directly overlie conductive material (i.e., overlies an area that includes a non-conductive material), very little or no Eddy current is generated and the Eddy current signal 34 dips. For example, as shown in FIG. 3, when the thickness sensor 10 is in a second position 46 and directly overlies an area 47 which is free of conductive material, the Eddy current signal 34 has a valley 48. The amplitude of the valleys of the Eddy current signal 34 is dependent on the amount of conductive material, or lack of conductive material, that underlies the thickness sensor 10. For example, as shown in FIG. 3, when the thickness sensor 10 is in the second position 46, the Eddy current signal 34 has its lowest valley 48 as the area 47 is the largest area without conductive material.

Comparing the Eddy current signal 34 to the Eddy current signal 36, which was generated by the Eddy current sensor having a large sensor spot size (e.g., an Eddy current sensor including a sensor coil with a diameter between 15 millimeters and 20 millimeters), it can be seen that the thickness sensor 10 amplifies the peaks and valleys of the Eddy current signal generated by the Eddy current reader 16. For example, the amplitude of a peak 50 of the Eddy current signal 36, which corresponds to the first position 42, is much smaller than the amplitude of the peak 45. Similarly, the amplitude of a valley 52 of the Eddy current signal 36, which corresponds to the second position 46, is much greater than the amplitude of the valley 48. Accordingly, the fluctuations between the peaks and valleys of the Eddy current signal 34 are much more exaggerated compared to the Eddy current signal 36.

Figure 4:
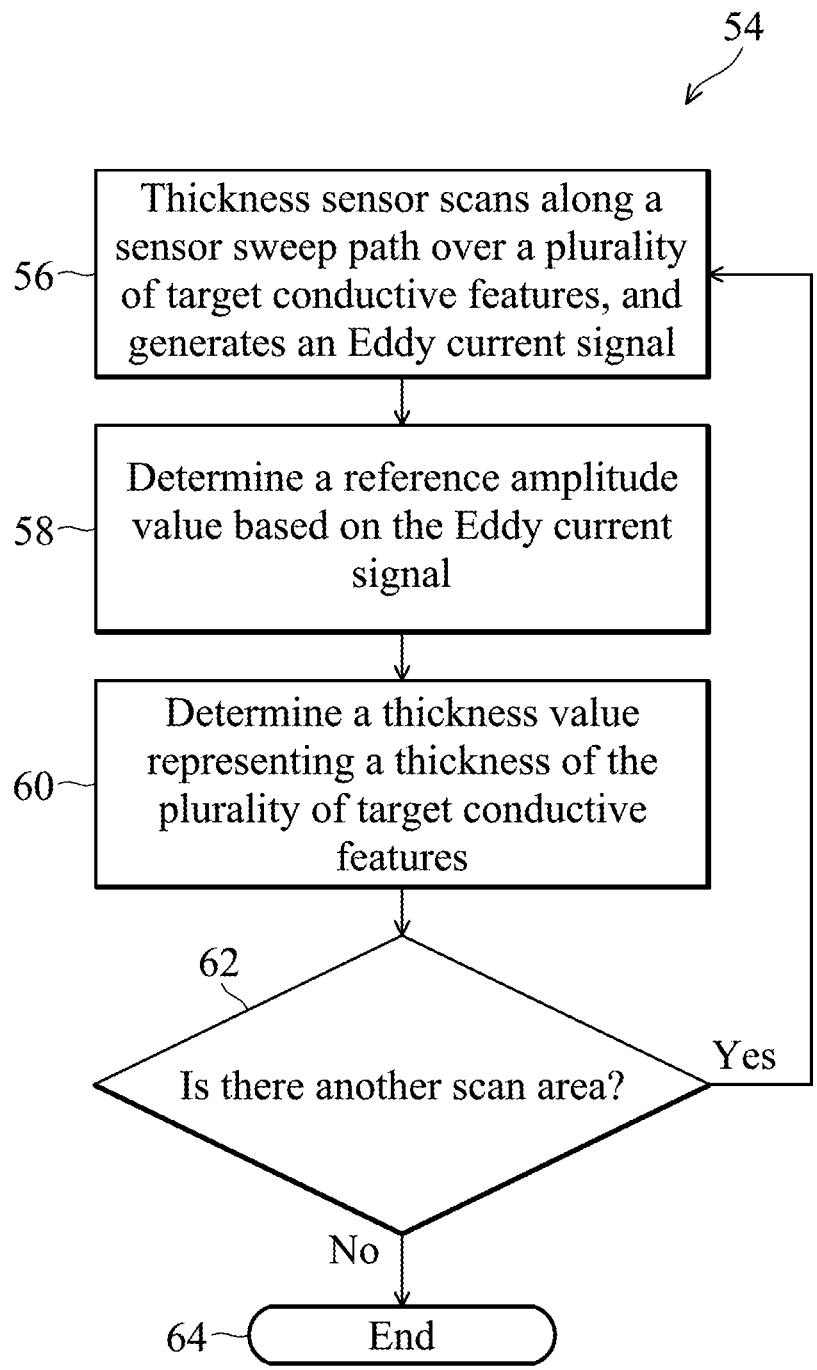
FIG. 4 is a flow diagram of a method of operating the thickness sensor of FIG. 1 in accordance with some embodiments.

The thickness sensor 10 takes advantage of the exaggerated fluctuations (i.e., peaks and valleys) of the Eddy current signal generated by the Eddy current reader 16 to interpret a thickness of discrete conductive features. FIG. 4 is a flow diagram of a method 54 of operating the thickness sensor 10 in accordance with some embodiments.

In block 56, the thickness sensor 10 scans along a sensor sweep path over a plurality of target conductive features, and generates an Eddy current signal. For example, in the embodiment shown in FIGS. 2 and 3, the thickness sensor 10 scans along the sensor sweep path 32 over the conductive features 39 and generates the Eddy current signal 34. As previously discussed with respect to FIG. 1, in various embodiments, the Eddy current signal is a measured Eddy current of an Eddy current generated in discrete conductive features by the drive coil 14. As previously discussed, in various embodiments, the plurality of target conductive features is formed from a conductive film or layer. For instance, in one or more embodiments, the conductive features 39 are part of the conductive film 38.

In block 58, the thickness sensor 10 determines a reference amplitude value based on the Eddy current signal. In one embodiment, the reference amplitude value is determined by the processor 20. As will be discussed in further detail with respect to block 60, the reference amplitude value is used as a calibration point to determine a thickness value representing a thickness of a plurality of conductive features.

In one embodiment, the reference amplitude value is set to be equal to the minimum amplitude value of the Eddy current signal. For example, in the embodiment shown in FIG. 3, the reference amplitude value for the Eddy current signal 34 is set to be equal to the amplitude of the valley 48. In one embodiment, the minimum amplitude value is a non-zero value. As previously discussed, the amplitude of peaks of an Eddy current signal is dependent on the amount of conductive material that underlies the thickness sensor 10. Accordingly, by using the minimum amplitude value of the Eddy current signal for the reference amplitude value, the reference amplitude value represents an amplitude value corresponding to a small thickness of conductive material or an area with a lower density of conductive material (i.e., an area with very little, if any, conductive material). For example, in the embodiment shown in FIG. 3, when the reference amplitude value is set to be equal to the amplitude of the valley 48, the reference amplitude value represents an amplitude value corresponding to the area 47, which has no conductive material.

In block 60, the thickness sensor 10 determines or calculates a thickness value representing a thickness of the plurality of target conductive features. In one embodiment, the thickness value of the plurality of target conductive features is determined by the processor 20.

In one embodiment, the thickness sensor 10 determines the thickness value based on a difference between the reference amplitude value determined in block 58 and a maximum amplitude value of the Eddy current signal. For example, in the embodiment shown in FIGS. 2 and 3, when the reference amplitude value is set to be equal to the amplitude of the valley 48, a thickness t1 of the conductive features 39 is determined based on a difference s1 between the amplitude value of the valley 48 and the amplitude value of the peak 45.

As the reference amplitude value represents an amplitude value corresponding to a small thickness, the difference between the reference amplitude value and a maximum amplitude value of the Eddy current signal is proportional to the thickness of the conductive features within the scan area (i.e., along the sensor sweep path). That is, a large difference between the reference amplitude value and a maximum amplitude value indicates a large thickness, and a small difference between the reference amplitude value and a maximum amplitude value indicates a small thickness. In one embodiment, the difference between the reference amplitude value and a maximum amplitude value is compared to a look up table to determine a corresponding thickness of the conductive features.

In another embodiment, in block 60, the thickness sensor 10 determines or calculates a density value representing a density of the plurality of target conductive features. In one embodiment, the density value of the plurality of target conductive features is determined by the processor 20.

Similar to the determining of a thickness value, in one embodiment, the thickness sensor 10 determines the density value based on a difference between the reference amplitude value determined in block 58 and a maximum amplitude value of the Eddy current signal. For example, in the embodiment shown in FIGS. 2 and 3, when the reference amplitude value is set to be equal to the amplitude of the valley 48, a density of the conductive features 39 is determined based on a difference s1 between the amplitude value of the valley 48 and the amplitude value of the peak 45.

As the reference amplitude value also represents an amplitude value corresponding to an area with a lower density of conductive material, the difference between the reference amplitude value and a maximum amplitude value of the Eddy current signal is proportional to the density of the conductive features within the scan area (i.e., along the sensor sweep path). That is, a large difference between the reference amplitude value and a maximum amplitude value indicates a high density of conductive material, and a small difference between the reference amplitude value and a maximum amplitude value indicates a low density of conductive material. In one embodiment, the difference between the reference amplitude value and a maximum amplitude value is compared to a look up table to determine a corresponding density of the conductive features.

In block 62, the thickness sensor 10 determines if there is another scan area. In one embodiment, the processor 20 determines if there is another scan area. The other scan area may be on the same wafer as the first scan in block 56, or on another separate wafer. If there is not another scan area, the method 54 moves to block 64 and the method 54 ends. If there is another scan area, the method 54 returns to block 56 where blocks 58, 60, and 62 are repeated.

In one embodiment, the thickness sensor 10 is used for in-situ monitoring of thickness during a polishing process, such as chemical mechanical polishing (CMP), of conductive features formed on a wafer. By performing the method 54 simultaneously with a polishing process, a thickness of the conductive features may be monitored in real time. For example, in one embodiment, blocks 56, 58, and 60 are performed simultaneously with a CMP process, and a current thickness determined in block 60 is used to adjust the CMP process (e.g., stop the CMP process when a desired thickness is reached, continue the CMP process if a desired thickness is not reached, etc.) in real time. Using the thickness sensor 10 during a polishing process will be discussed in further detail with respect to FIG. 6.

Figure 5:
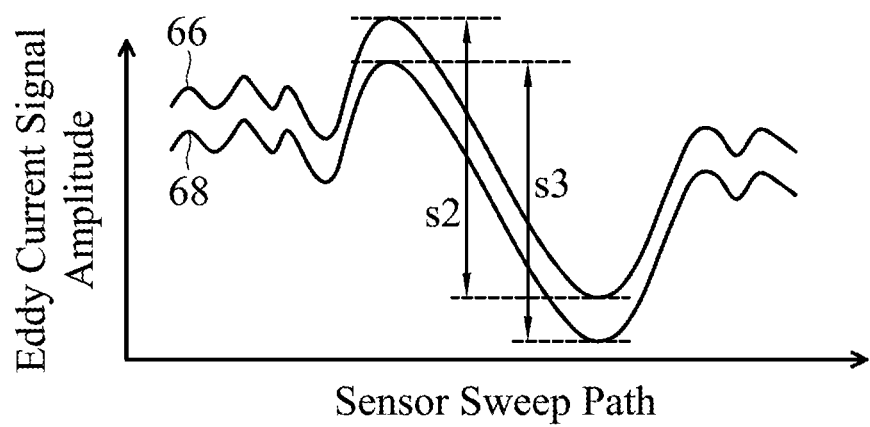
FIG. 5 is a diagram of two Eddy current signals measured by the thickness sensor of FIG. 1 for two scans over the same sensor sweep path in accordance with some embodiments.

It is noted that in accordance with various embodiments described herein, the reference amplitude value is recalculated for each scan of the method 54. That is, for every sensor sweep path, a new reference amplitude value is determined in block 58. By updating the reference amplitude value, the thickness sensor 10 is recalibrated scan-to-scan. As a result, variations in Eddy current signals between scans caused by noise sources, such as temperature changes, mechanical vibration, etc., are minimized, and signal-to-noise ratio is improved. FIG. 5 is a diagram of two Eddy current signals 66, 68 measured by the thickness sensor 10 for two scans over the same sensor sweep path 32 in accordance with some embodiments. The Eddy current signal 66 is generated by a first scan over the sensor sweep path 32, and the Eddy current signal 68 is generated by a second scan over the sensor sweep path 32.

Although the Eddy current signals 66, 68 were obtained by scanning over the same sensor sweep path, the amplitudes of the Eddy current signal 68 is lower than the amplitudes of the Eddy current signal 66. The lowering of the amplitudes of the Eddy current signal 68 may be caused by, for example, noise sources, such as temperature changes, mechanical vibration, etc. However, as shown in FIG. 5, the peak-to-valley value remains substantially the same. For example, a difference s2 between the minimum amplitude value (i.e., the reference amplitude value) and the maximum amplitude value of the Eddy current signal 66 is substantially equal to the difference s3 between the minimum amplitude value and the maximum amplitude value of the Eddy current signal 68. Thus, although the overall amplitude of the Eddy current signal may change from scan-to-scan, the difference between the minimum amplitude value and the maximum amplitude value of the Eddy current signal remains substantially the same. As a result, the determination of a thickness in block 60 remains consistent between two scans by the thickness sensor 10. Accordingly, a thickness of discrete conductive features may be accurately measured repeatedly.

Figure 6:
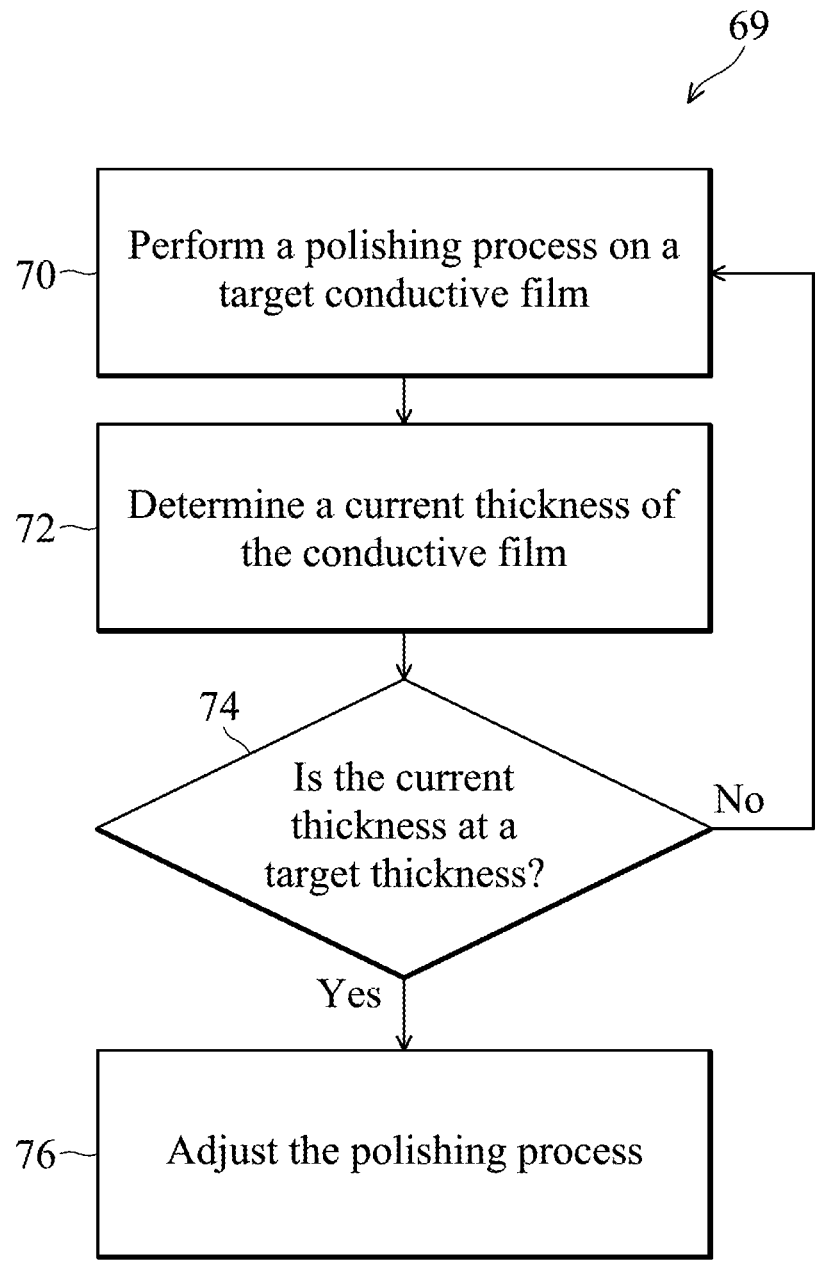
FIG. 6 is a flow diagram of a method of performing a polishing process in accordance with some embodiments.

As previously discussed, signals received by existing Eddy current sensors are often weak and/or noisy when the existing Eddy current sensors are used to measure thicknesses of discrete conductive features. Consequently, the accuracy of measuring thicknesses of discrete conductive features with existing Eddy current sensors is compromised. In contrast, the thickness sensor 10 is capable of providing accurate thickness measurements of discrete conductive features. Accordingly, the thickness sensor 10 is well suited for in-situ monitoring of thickness during a polishing process of discrete conductive features formed on a substrate. FIG. 6 is a flow diagram of a method 69 of performing a polishing process in accordance with some embodiments.

In block 70, a polishing module performs a polishing process on a target conductive film or layer on a substrate. The polishing module may be any type of device that is used to planarize or smooth a surface. For example, in one embodiment, the polishing module is a CMP module.

In one embodiment, the target conductive film is polished to form a plurality of discrete conductive features, such as conductive lines or conductive plugs. For example, referring to FIG. 2, the target conductive film may be the conductive film 38, and is polished to form the discrete conductive features 39.

In one embodiment, the polishing process is performed as part of backend of line (BEOL) processing of a semiconductor device. For example, the target conductive film may be a metallization layer, and the polishing module polishes the target conductive film to form wiring to interconnect a plurality of electrical components (e.g., transistors, resistors, capacitors, etc.).

In block 72, the thickness sensor 10 determines a current thickness of the target conductive film. In one embodiment, the thickness sensor 10 determines a current thickness using the method 54 described with respect to FIG. 4. For example, the thickness sensor 10 scans along a sensor sweep path over the target conductive film and generates an Eddy current signal (block 56), determines a reference amplitude value based on the Eddy current signal (block 58), and determines or calculates a thickness value representing a thickness of the target conductive film.

In one embodiment, the thickness sensor 10 determines the current thickness simultaneously with the polishing process performed in block 70. Stated differently, the thickness sensor 10 performs the method 54 (e.g., blocks 56, 58, and 60) and measures the current thickness concurrently with the target conductive film being polished.

In one embodiment, the thickness sensor 10 determines the current thickness subsequent to the polishing process performed in block 70. In this embodiment, the polishing module performs the polishing process for a predetermined period of time and is stopped. Once the polishing module has stopped, the thickness sensor 10 then determines the current thickness of the target conductive film.

In one embodiment, the thickness sensor 10 is incorporated in to the polishing module. Stated differently, the thickness sensor 10 and the polishing module are combined in a single module or apparatus that is configured to perform polishing and thickness measurement. In one embodiment, the polishing module and the thickness sensor 10 are separate modules.

In block 74, it is determined whether the current thickness is at a target thickness. In one embodiment, the processor 20 of the thickness sensor 10 determines whether the current thickness is at a target thickness. In one embodiment, the thickness sensor 10 transmits the current thickness to the polishing module, and the polishing module determines whether the current thickness is at a target thickness. In one embodiment, the thickness sensor 10 transmits the current thickness to an external processor or controller that is separate from the thickness sensor 10 and the polishing module, and the external processor determines whether the current thickness is at a target thickness.

If the current thickness is not substantially equal to the target thickness, the method 69 returns to block 70. Upon returning to block 70, the polishing process is continued.

If the current thickness is substantially equal to the target thickness, the method 69 moves to block 76. In block 76, the polishing module adjusts the polishing process. In one embodiment, the polishing module stops the polishing process. In one embodiment, the polishing module increases the speed of the polishing process. In one embodiment, the polishing module decreases the speed of the polishing process.

The method 69 provides closed-loop control for the polishing module. Namely, as the thickness sensor 10 is able to measure the thickness of the target conductive film in conjunction with the polishing process, the thickness of the target conductive film may be used to as feedback loop to adjust the polishing process. As a result, discrete conductive features with accurate thicknesses may be obtained. Accordingly, the need for post thickness measurement and polishing reprocessing due to thickness variation is reduced. In addition, repeatability of a polishing process for a desired thickness for both "wafer-to-wafer" and "with-in-wafer" control is improved.

The various embodiments provide a thickness sensor and method for measuring a thickness of discrete conductive features. The thickness sensor may be used for real time, in-situ monitoring of a thickness of discrete conductive features during a polishing process, such as CMP.

According to one embodiment disclosed herein, a method includes generating an Eddy current signal based on Eddy currents induced in a plurality of conductive features on a substrate, and calculating a thickness value representing a thickness of the conductive features. The calculating of the thickness value includes determining a maximum amplitude value of the Eddy current signal; determining a minimum amplitude value of the Eddy current signal; and determining a difference between the maximum amplitude value and the minimum amplitude value.

According to one embodiment disclosed herein a method includes measuring Eddy currents in a plurality of conductive features on a substrate; generating an Eddy current signal based on the measured Eddy currents; determining a maximum amplitude value of the Eddy current signal; determining a minimum amplitude value of the Eddy current signal; and calculating a thickness value representing a thickness of the conductive features based on the maximum amplitude value and the minimum amplitude value.

According to one embodiment disclosed herein a method includes scanning a first plurality of conductive features on a substrate. The scanning of the first plurality of conductive features includes inducing first Eddy currents in the first plurality of conductive features; measuring the first Eddy currents in the first plurality of conductive features; and generating a first Eddy current signal based on the measured first Eddy currents. The method further includes determining a reference amplitude value based on a minimum amplitude value of the first Eddy current signal; and calculating a thickness value representing a thickness of the first plurality of conductive features based on the reference amplitude value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating an Eddy current signal based on Eddy currents induced in a plurality of conductive features on a substrate; and
   calculating a thickness value representing a thickness of the conductive features, the calculating of the thickness value including:
      determining a maximum amplitude value of the Eddy current signal;
      determining a minimum amplitude value of the Eddy current signal; and
      determining a difference between the maximum amplitude value and the minimum amplitude value.

2. The method of claim 1 wherein the plurality of conductive features are electrically isolated from each other.

3. The method of claim 1, further comprising:
   measuring the Eddy currents using a coil.

4. The method of claim 1 wherein the calculating of the thickness value is performed simultaneously with a chemical mechanical polishing (CMP).

5. The method of claim 4, further comprising:
   adjusting the CMP based on the thickness value.

6. The method of claim 1, further comprising:
   calculating a density value representing a density of the conductive features based on the difference between the maximum amplitude value and the minimum amplitude value.

7. A method, comprising:
   measuring Eddy currents in a plurality of conductive features on a substrate;
   generating an Eddy current signal based on the measured Eddy currents;
   determining a maximum amplitude value of the Eddy current signal;
   determining a minimum amplitude value of the Eddy current signal; and
   calculating a thickness value representing a thickness of the conductive features based on the maximum amplitude value and the minimum amplitude value.

8. The method of claim 7 wherein the calculating of the thickness value includes calculating a difference between the maximum amplitude value and the minimum amplitude value.

9. The method of claim 7 wherein the plurality of conductive features are electrically isolated from each other.

10. The method of claim 7, further comprising:
    inducing the Eddy currents in the plurality of conductive features, the Eddy currents being induced using a first coil, the Eddy currents being measured using a second coil.

11. The method of claim 10 wherein the first coil has a first diameter, and the second coil has a second diameter that is smaller than the first diameter.

12. The method of claim 10 wherein the first coil has a first diameter, and the second coil has a second diameter that is substantially equal to the first diameter.

13. The method of claim 7, further comprising:
    performing a polishing process; and
    stopping the polishing process based on the thickness value.

14. A method, comprising:
    scanning a first plurality of conductive features on a substrate, the scanning of the first plurality of conductive features including:
       inducing first Eddy currents in the first plurality of conductive features;
       measuring the first Eddy currents in the first plurality of conductive features; and
       generating a first Eddy current signal based on the measured first Eddy currents;
    determining a reference amplitude value based on a minimum amplitude value of the first Eddy current signal; and
    calculating a thickness value representing a thickness of the first plurality of conductive features based on the reference amplitude value.

15. The method of claim 14, further comprising:
    scanning a second plurality of conductive features, the scanning of the second plurality of conductive features including:
       inducing second Eddy currents in the second plurality of conductive features;
       measuring the second Eddy currents in the second plurality of conductive features; and
       generating a second Eddy current signal based on the measured second Eddy currents;
    updating the reference amplitude value based on a minimum amplitude value of the second Eddy current signal; and calculating a thickness value representing a thickness of the second plurality of conductive features based on the updated reference amplitude value.

16. The method of claim 14 wherein calculating the thickness value includes calculating a difference between a maximum amplitude value of the first Eddy current signal and the reference amplitude value.

17. The method of claim 14 wherein the first plurality of conductive features are electrically isolated from each other.

18. The method of claim 14 wherein the first Eddy currents are measured using a coil.

19. The method of claim 14 wherein the scanning of the first plurality of conductive features is performed simultaneously with a chemical mechanical polishing (CMP).

20. The method of claim 14, further comprising:
    performing a polishing process; and
    adjusting the polishing process based on the thickness value.

* * * * *